US011043256B2

(12) United States Patent
Vaidyanathan et al.

(10) Patent No.: US 11,043,256 B2
(45) Date of Patent: Jun. 22, 2021

(54) HIGH BANDWIDTH DESTRUCTIVE READ EMBEDDED MEMORY

(71) Applicant: Intel Corporation, Santa Clara, CA (US)

(72) Inventors: Kaushik Vaidyanathan, Santa Clara, CA (US); Huichu Liu, Santa Clara, CA (US); Tanay Karnik, Portland, OR (US); Sreenivas Subramoney, Bangalore (IN); Jayesh Gaur, Bangalore (IN); Sudhanshu Shukla, Bangaluru (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/458,022

(22) Filed: Jun. 29, 2019

(65) Prior Publication Data

US 2020/0411079 A1 Dec. 31, 2020

(51) Int. Cl.
*G11C 11/4096* (2006.01)
*G11C 7/10* (2006.01)
(Continued)

(52) U.S. Cl.
CPC ........ *G11C 11/4091* (2013.01); *G11C 7/1006* (2013.01); *G11C 7/1051* (2013.01);
(Continued)

(58) Field of Classification Search
CPC . G11C 7/1006; G11C 7/1051; G11C 11/4096; G11C 7/22; G11C 11/4091; G11C 11/4094; G11C 11/4097
(Continued)

(56) References Cited

U.S. PATENT DOCUMENTS 4,931,994 A * 6/1990 Matsui .................. G11C 11/419 365/189.15
5,361,233 A * 11/1994 Kotani ..................... G11C 7/06 365/207

(Continued)

FOREIGN PATENT DOCUMENTS

KR 20100081059 7/2010
KR 20170056109 5/2017

OTHER PUBLICATIONS

Hamzaoglu, Fatih et al., "A 1 Gb 2 GHz 128 GB/s Bandwidth Embedded DRAM in 22 nm Tri-Gate CMOS Technology", IEEE Journal of Solid-State Circuits, vol. 50, No. 1, Jan. 2015, 8 pgs.

(Continued)

*Primary Examiner* — Son L Mai
(74) *Attorney, Agent, or Firm* — Green, Howard & Mughal LLP

(57) ABSTRACT

Described are mechanisms and methods for amortizing the cost of address decode, row-decode and wordline firing across multiple read accesses (instead of just on one read access). Some or all memory locations that share a wordline (WL) may be read, by walking through column multiplexor addresses (instead of just reading out one column multiplexor address per WL fire or memory access). The mechanisms and methods disclosed herein may advantageously enable N distinct memory words to be read out if the array uses an N-to-1 column multiplexor. Since memories such as embedded DRAMs (eDRAMs) may undergo a destructive read, for a given WL fire, a design may be disposed to sense N distinct memory words and restore them in order.

21 Claims, 9 Drawing Sheets

610

614 BL0 • • • BLN N:1 BL0 BLN N:1

LBL0 • • • LBLM 611

LSA0 LSAM 612 column mux M:1

613 GBL0 (long wire)

GSA

(51) Int. Cl.
*G11C 11/4091* (2006.01)
*G11C 11/4097* (2006.01)
*G11C 11/408* (2006.01)
*G11C 11/4094* (2006.01)
*G11C 7/22* (2006.01)

(52) U.S. Cl.
CPC ............ *G11C 7/22* (2013.01); *G11C 11/4085* (2013.01); *G11C 11/4087* (2013.01); *G11C 11/4094* (2013.01); *G11C 11/4096* (2013.01); *G11C 11/4097* (2013.01)

(58) Field of Classification Search
USPC ..................................................... 365/189.02
See application file for complete search history.

(56) References Cited

U.S. PATENT DOCUMENTS

| | | | | | |
|---|---|---|---|---|---|
| 6,044,433 | A * | 3/2000 | Zagar | G11C 7/103 | 711/105 |
| 6,137,730 | A * | 10/2000 | Chien | G11C 7/1048 | 365/189.02 |
| 7,154,810 | B2 * | 12/2006 | Winograd | G06F 13/4086 | 365/189.011 |
| 7,616,513 | B1 * | 11/2009 | Peng | G11C 7/062 | 365/185.21 |
| 7,817,491 | B2 * | 10/2010 | Kwak | G11C 7/1069 | 365/230.02 |
| 8,004,912 | B2 * | 8/2011 | Terzioglu | G06F 13/4086 | 365/200 |
| 8,050,114 | B2 * | 11/2011 | Van Winkelhoff | G11C 7/1048 | 365/189.02 |
| 8,116,149 | B2 * | 2/2012 | Chen | G11C 11/413 | 365/189.15 |
| 8,238,183 | B2 * | 8/2012 | Yoshida | G11C 7/02 | 365/203 |
| 8,467,217 | B2 * | 6/2013 | Takayama | G11C 11/4091 | 365/205 |
| 8,638,630 | B2 * | 1/2014 | Kajigaya | G11C 7/1048 | 365/185.13 |
| 9,875,809 | B2 | 1/2018 | Shin | | |
| 9,922,695 | B2 * | 3/2018 | Tomishima | G11C 7/1006 | |
| 2013/0016576 | A1 | 1/2013 | O'Connell | | |
| 2014/0003160 | A1 | 1/2014 | Trivedi et al. | | |
| 2016/0005455 | A1 | 1/2016 | Vogelsang et al. | | |

OTHER PUBLICATIONS

International Search Report and Written Opinion from PCT/US2020/035589 dated Sep. 11, 2020, 14 pgs.

* cited by examiner

HIGH BANDWIDTH DESTRUCTIVE READ EMBEDDED MEMORY

BACKGROUND

Destructive read embedded memories such as embedded Dynamic Random Access Memory (eDRAM) are in use today, at least in part due to their relatively high capacities. However, their use close to cores (e.g., processing cores) has been limited by their relatively high latencies and relatively low bandwidths.

One common way to increase bandwidths may be to divide an embedded memory into discrete banks that can be read from and written to in parallel. However, additional circuitry that may be employed (e.g., to the banks or the embedded memories) may increase area consumption. Accordingly, techniques like banking may increase bandwidths, but may also incur area overhead.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
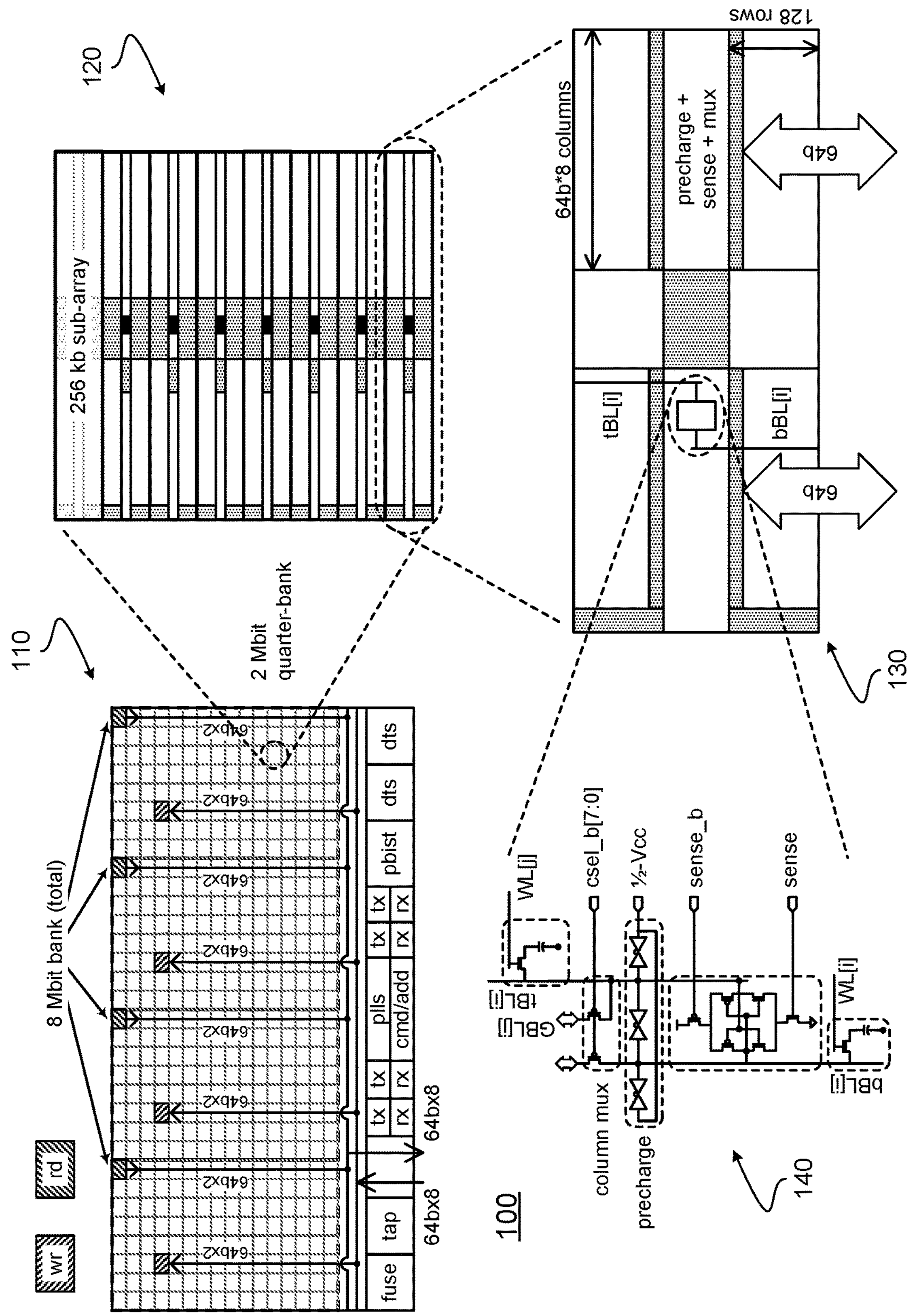
FIG. 1 illustrates an embedded Dynamic Random Access Memory (eDRAM) design and array organization, in accordance with some embodiments of the disclosure.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Disclosed herein are methods and mechanisms for providing low-area-overhead increases to the bandwidth of destructive read embedded memories, such as for caching application in microprocessors. In various embodiments, the cost of address decode, row-decode, and wordline firing (e.g., wordline selection and/or enabling) may be amortized across multiple read accesses, instead of just on one read access. In some embodiments, some or all memory locations that share a wordline may be read by walking through column multiplexor addresses, instead of just reading out one column multiplexor address per WL firing or memory access. As a result, the mechanisms and methods may enable N distinct memory words to be read out if the array uses an N-to-1 column multiplexor. Since memories like embedded Dynamic Random Access Memory (eDRAM) may undergo destructive reads, for a given WL fire, N distinct memory words might be sensed and restored in order.

In a variety of embodiments, the mechanisms and methods herein may provide a high bandwidth eDRAM with a shared LSA. The mechanisms and methods herein may advantageously increase an embedded memory bandwidth by reading out N memory words per address decode and WL fire. Furthermore, for streaming access patterns (such as prefetches) in a modern microprocessor or machine learning accelerator, the mechanisms and methods herein may also advantageously reduces access latencies.

FIG. 1 illustrates an eDRAM design and array organization, in accordance with some embodiments of the disclosure. In a scenario 100, a macro 110 may be a memory array comprising a plurality of banks, each of which may be distributed as partial banks 120 across multiple portions of macro 110. In turn, each partial bank 120 may comprise a plurality of sub-arrays 130.

Sub-arrays 130 may comprise arrays of stored bits (for example, bitcells of a variety of memory technologies, such as eDRAM memory, emerging non-volatile memories, and so forth). Sub-arrays 130 may also comprise Local Sensing Amplifier (LSA) arrays adjacent to the storage arrays, in which a plurality of LSAs 140 may follow bit-cell pitch matching. Column multiplexing of sub-arrays 130 may then select one output of the LSA array to a Global Sense Amplifier (GSA), which may be shared among sub-arrays.

For example, in some embodiments, a 1-gigabit (Gb) macro may have 128 independent 8-megabit (Mb) banks for read and write, distributed across four portions in four 2 Mb quarter-banks. In turn, each quarter-bank may have eight 256 kilobit (kb) sub-arrays. Each sub-array may have column multiplexing for 8 LSAs corresponding to 8 columns (e.g., 8-to-1 column multiplexing for LSAs from an LSA0 to an LSA8). Each bank of the macro may read out 64 bytes (B) per access, with each quarter-bank's sub-arrays providing two sets of 64 bits (b) per access. A random cycle time may be 6 array clocks (with, e.g., a 0.5 nanoseconds (ns) clock period).

A typical read operation of a conventional eDRAM sub-array may proceed as follows. First, bitlines may be pre-charged to half of a positive supply voltage level ("VCC"). Second, wordline activation and voltage may develop on a selected row. Third, LSAs may sense voltages on bitlines and write back. (A write-back operation may be desirable for eDRAM, since eDRAM may use a destructive read scheme.) Fourth, one of multiple LSA outputs may be column-selected to a GSA. Due to pitch-matching constraints of layout (e.g., having each column correspond with and/or be aligned with one LSA), the complexity and/or area allocation of a conventional sense amplifier design may be limited, which may in turn result in sensing latency increases, write-back latency increases, and/or sensing margin limits at advanced technology nodes.

For sequential data access (e.g., sequential address access for data on a plurality of bitlines BL 0 to BL 7), a bank blocking latency may equal a read latency, and a random bandwidth may also equal a sequential bandwidth.

Figure 2:
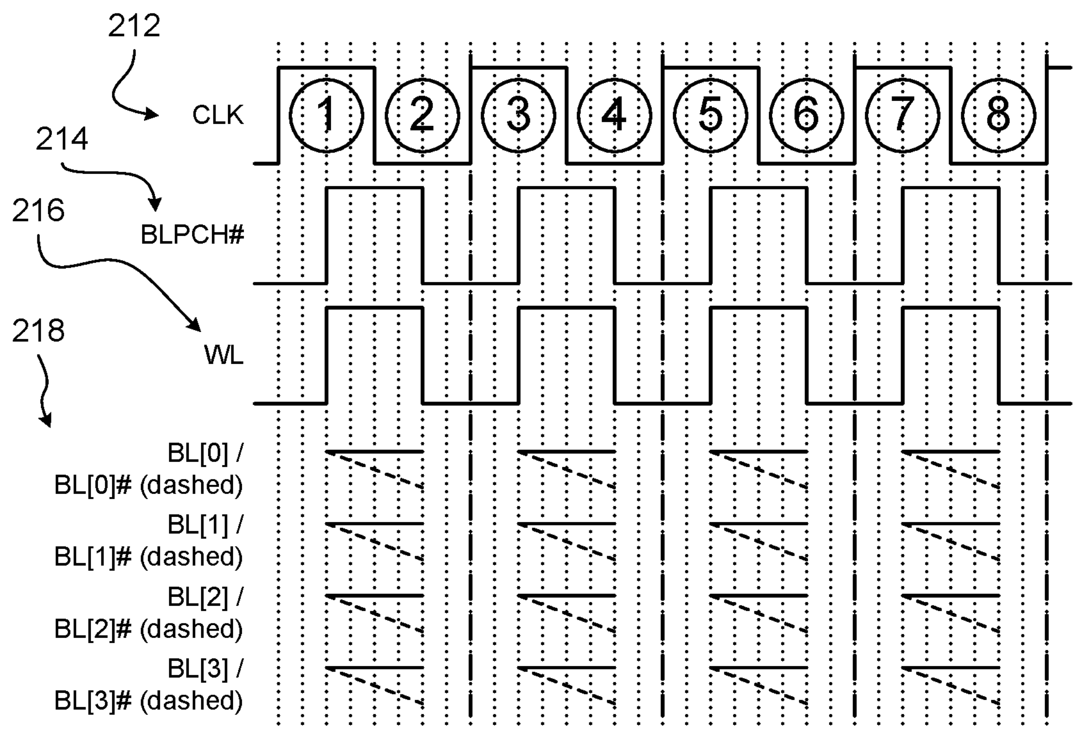
FIG. 2 illustrates high speed sequential sensing amplifier designs for Static Random Access Memory (SRAM), in accordance with some embodiments of the disclosure.
Figure 2:
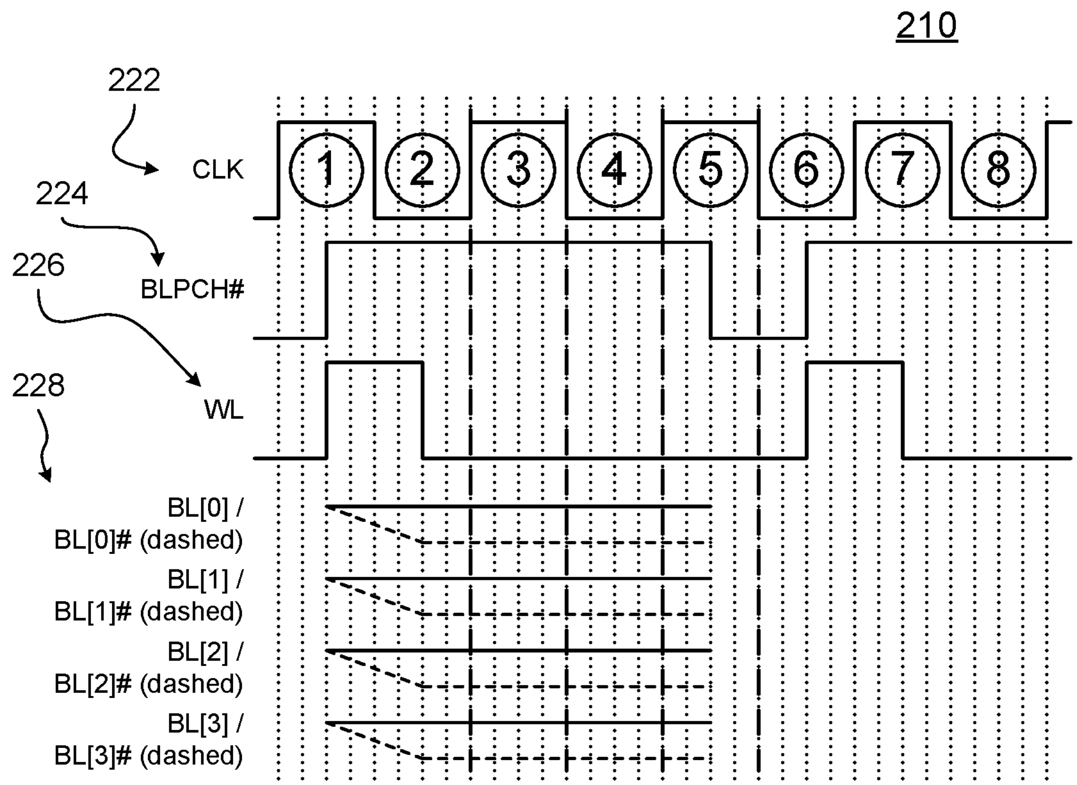

FIG. 2 illustrates high speed sequential sensing amplifier designs for Random Access Memory (RAM), in accordance with some embodiments of the disclosure. In a first scenario 210, a bitline precharge signal 214 and a wordline signal 216 may toggle in sequential cycles of a clock signal 212 to read data from a memory array to a plurality of bitline signals 218. This may result in multiple bitline prechargings to read out multiple bits. In comparison, in a second scenario 220, a bitline precharge signal 214 may be deasserted for multiple cycles of a clock signal 222, and a wordline signal 214 may activate at the beginning of the deassertion of the bitline precharge signal, to recover data from a memory array to a plurality of bitline signals 228. This may result in a single bitline precharge to read out multiple bits (e.g., by walking through column multiplexor addresses). Note that the Static RAM (SRAM) may use a shared sense amplifier (SA) after column multiplexing, since write-back might not be utilized (e.g., related to a non-destructive read).

Figure 3:
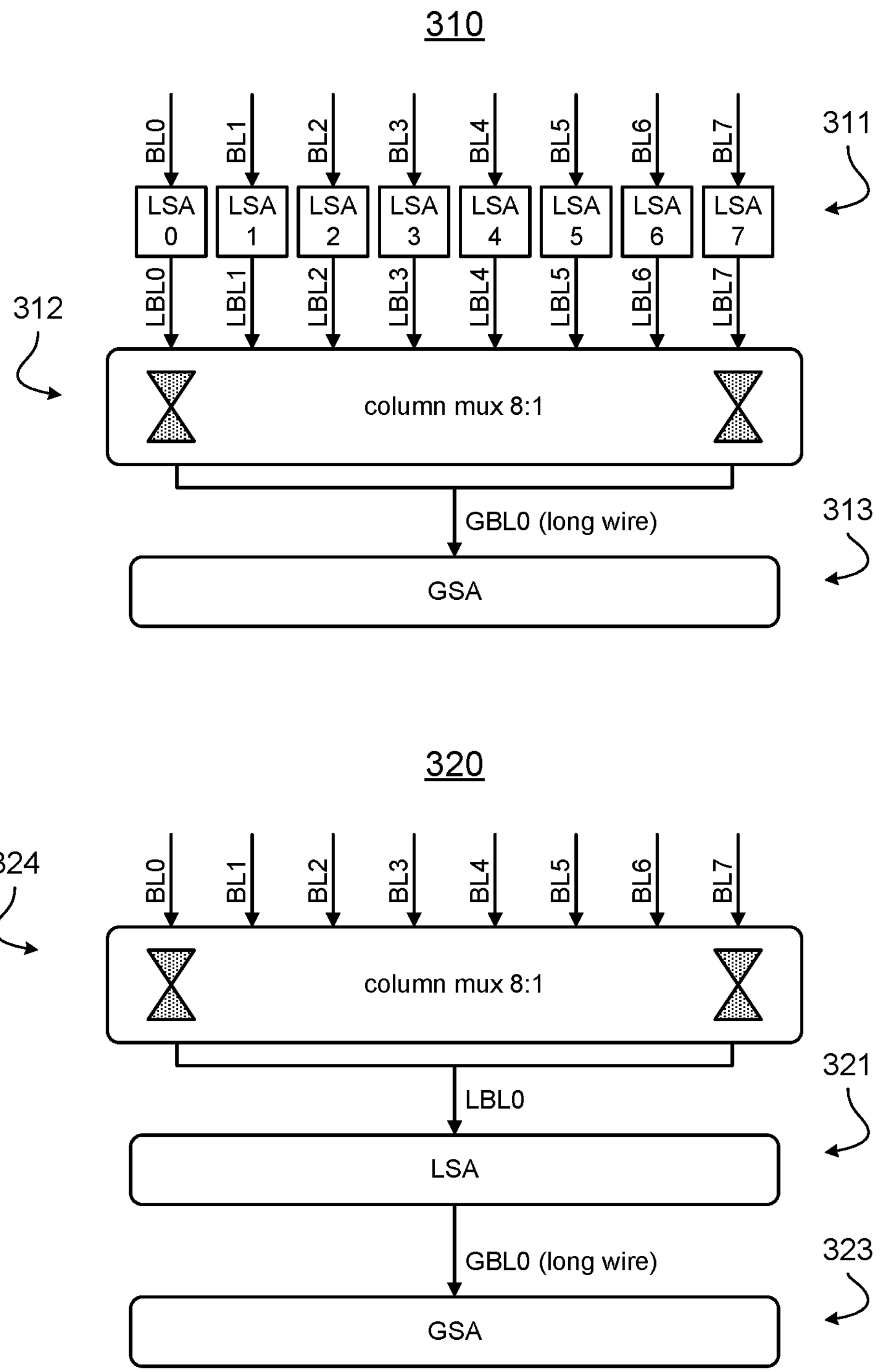
FIG. 3 illustrates scenarios of eDRAM sense amplification design, in accordance with some embodiments of the disclosure.

FIG. 3 illustrates scenarios of eDRAM sense amplification design, in accordance with some embodiments of the disclosure. In a first scenario 310, a plurality of bitlines (e.g., bitlines BL 0 to BL 7) may be provided to an LSA circuitry 311, which may comprise a respectively corresponding plurality of LSAs for local amplification (e.g., eight LSAs). The outputs of LSA circuitry 311 may then be provided to a column multiplexing circuitry 312 (e.g., an 8-to-1 column multiplexing circuitry) whose output may be provided to a GSA circuitry 313, which may be over a relatively long wire or signal path.

Alternatively, in a second scenario 320, a plurality of bitlines (e.g., bitlines BL 0 to BL 7) may be provided to a pre-LSA column multiplexing circuitry 324 whose output may be provided to an LSA circuitry 321, which may comprise a reduced number of LSAs for local amplification (e.g., merely one LSA). The output of LSA circuitry 321 may then be provided to a GSA circuitry 323, which may be over a relatively long wire or signal path.

Moreover, with reference to FIG. 2, the design of second scenario 320 may advantageously facilitate the amortization of the costs of address decode, row-decode, and/or wordline firing across multiple read accesses (instead of just on one read access). Instead of having an array of simple LSAs, a design using a reduced number of LSAs after a column multiplexor (e.g., a single LSA) may advantageously loosen area constraints of the LSA design, which may in turn facilitate or allow a more complex LSA design for high sensing speed. Accordingly, in comparison with first scenario 110, the reduction in the number of LSAs may advantageously accommodate better signal quality for signals sent to GSA 323.

For example, read operations for second scenario 320 may proceed as follows. Within the same cycle, a plurality of bitlines (e.g., BL 0 to BL 7) may be sequentially read out by LSA circuitry 321, and each bitline read may be followed by a write back to restore the value. For BL 1 through BL 7, operations such as decode and precharge might not be used, and therefore resources used for sequential accesses may be significantly reduced. The same LSA may be time-multiplexed to sense and/or restore BL 0 through BL 7 after each read.

These mechanisms and methods may have various advantages. For single accesses (e.g., merely accessing BL 0), an access latency may be reduced with a more complex (and thereby faster) LSA given the total area consumed by all of LSA 0 to LSA 7 in scenario 310. For sequential accesses to the same subarray (e.g., accessing BL 0 to BL 7), an overall access latency may be reduced, since decode and precharge might merely be performed for the first access (e.g., BL 0). In combination with techniques like pre-fetching, an overall data bandwidth may be increased without additional banking overhead.

Moreover, for random access to the same bank (e.g., BL 0 to BL 7), the bank blocking latency may be increased due to the increase of sequential read and/or write-back of the bitlines sharing the same LSA. Accordingly, designs of the sort in second scenario 320 may provide shorter read latencies (e.g., due to larger and/or more complex LSA design) and higher sequential-read bandwidth, although bank blocking latency (e.g., due to random access) may increase.

Figure 4:
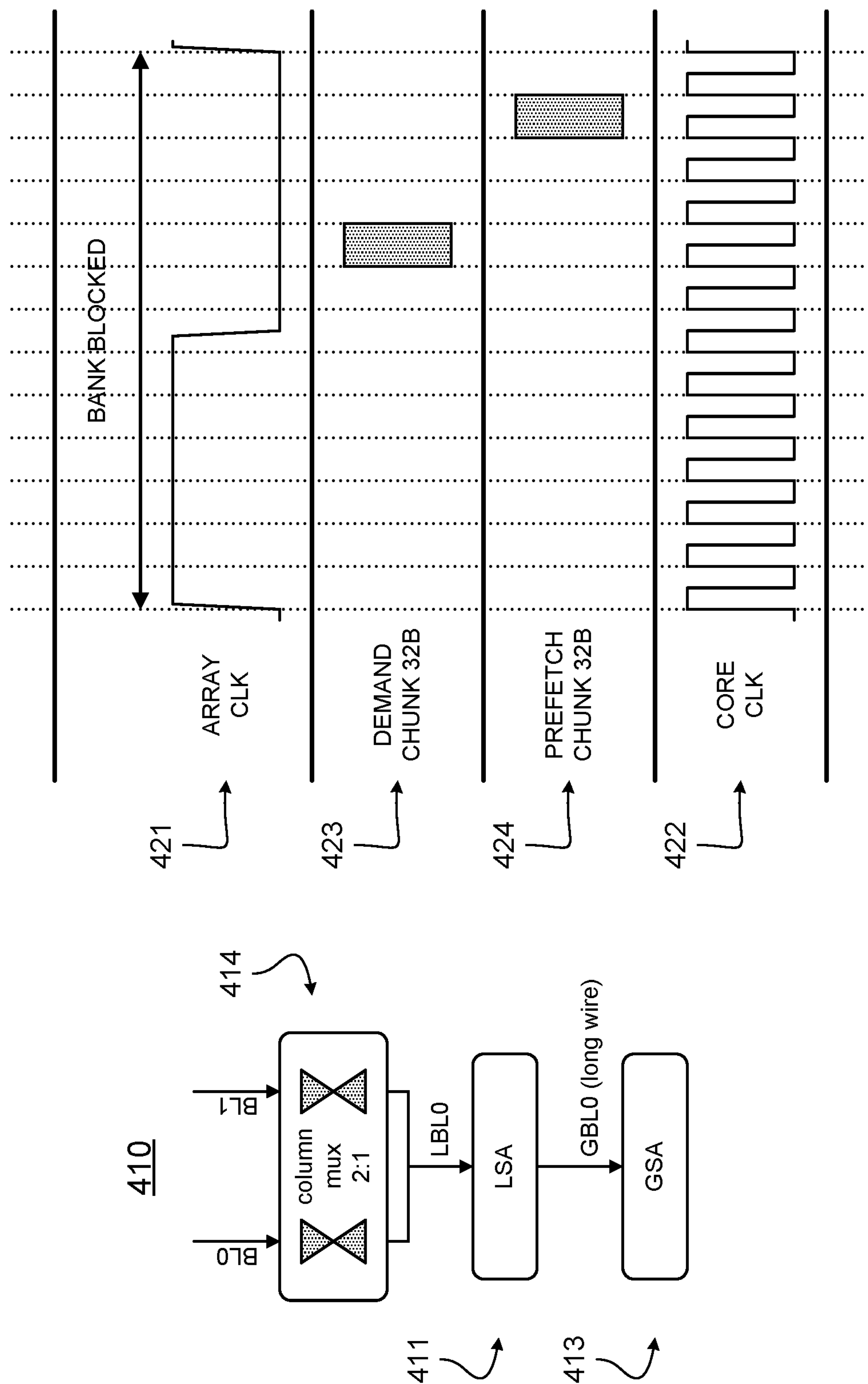
FIG. 4 a scenario of eDRAM sense amplification design using 2-to-1 column multiplexing and a timing diagram for splitting a cache line within a bank of a design using 2-to-1 column multiplexing, in accordance with some embodiments of the disclosure.

FIG. 4 illustrates a scenario of eDRAM sense amplification design using 2-to-1 column multiplexing and a timing diagram for splitting a cache line within a bank of a design using 2-to-1 column multiplexing, in accordance with some embodiments of the disclosure. Some embodiments may pertain to use cases in which cache lines are split within a bank. In a scenario 410, a plurality of bitlines (e.g., bitlines BL 0 to BL 1) may be provided to a pre-LSA column multiplexing circuitry 414 whose output may be provided to an LSA circuitry 411, which may comprise a reduced number of LSAs for local amplification (e.g., merely one LSA). The output of LSA circuitry 411 may then be provided to a GSA circuitry 413, which may be over a relatively long wire or signal path.

For a core clock of 4 gigahertz (GHz), an eDRAM may provide 64 B per bank access every 10 core clocks. In various embodiments, employing a 2-to-1 pre-LSA column multiplexing design, a cache line may be split within a bank. Therefore, one sub-array employing 2-to-1 column multiplexing may provide 128*2 bits (or 32 B) in the first 10 core clocks, and another 32 B in the next 3 core clocks (due to consecutive readout data from a shared LSA). As a result, two physical sub-arrays may advantageously provide the overall bandwidth of 128 B in 13 clock cycles.

For example, with respect to various embodiments, one cycle of an array clock 421 may comprise a plurality of cycles of a core clock 422. In the second half of the duty-cycle of array clock 421, a 32 B demand chunk 423 may be provided, followed by a 32 B prefetch chunk 424. A demand chunk latency may be unchanged, while a prefetch chunk latency may increase by 30% if the prefetch chunk was mapped to another physical bank. Accordingly, when employing 2-to-1 column multiplexing as disclosed herein, two physical sub-arrays may generate 128 B in 13 core clocks instead of generating 64 B in 10 core clocks, thereby advantageously increasing bandwidth, as shown in Table 1 below.

TABLE 1

Impact of pre-LSA column multiplexing

| column multiplexing | demand read latency (in core clocks) | bank block latency (in core clocks) | bytes every Last-Level Cache (LLC) clock |
|---|---|---|---|
| 2:1 | 10 | 13 | 64 B (32 B * 2) |
| 4:1 | 10 | 19 | 128 B (32 B * 4) |
| 8:1 | 10 | 31 | 256 B (32 B * 8) |

(In Table 1, demand read latencies may pertain to the first 32 B request.)

As Table 1 indicates, in various embodiments, increasing the level of pre-LSA column multiplexing in a design may further increase the bandwidth. In comparison with other approaches which may create more physical sub-arrays as a part of a logical bank, various embodiments disclosed herein may provide high bandwidths without incurring sub-array area overhead or increasing a demand request read latency. This may be beneficial in terms of dynamic power reduction and area savings. Also, for embedded applications, saved area may be allocated for more eDRAM capacity, which can further improve Instructions Per Clock (IPC).

In a variety of embodiments, the mechanisms and methods herein may provide a high bandwidth eDRAM with a partial shared LSA. In some embodiments, a high bandwidth eDRAM with a shared LSA may experience high bank blocking latencies for random accesses due to a sequential write-back of readout data sharing the same LSA. This overhead may increase as a function of the number of column multiplexing. Such costs may be worth bearing, however, to increase sequential-access performance, which may improve streaming media performance, for example.

Figure 5:
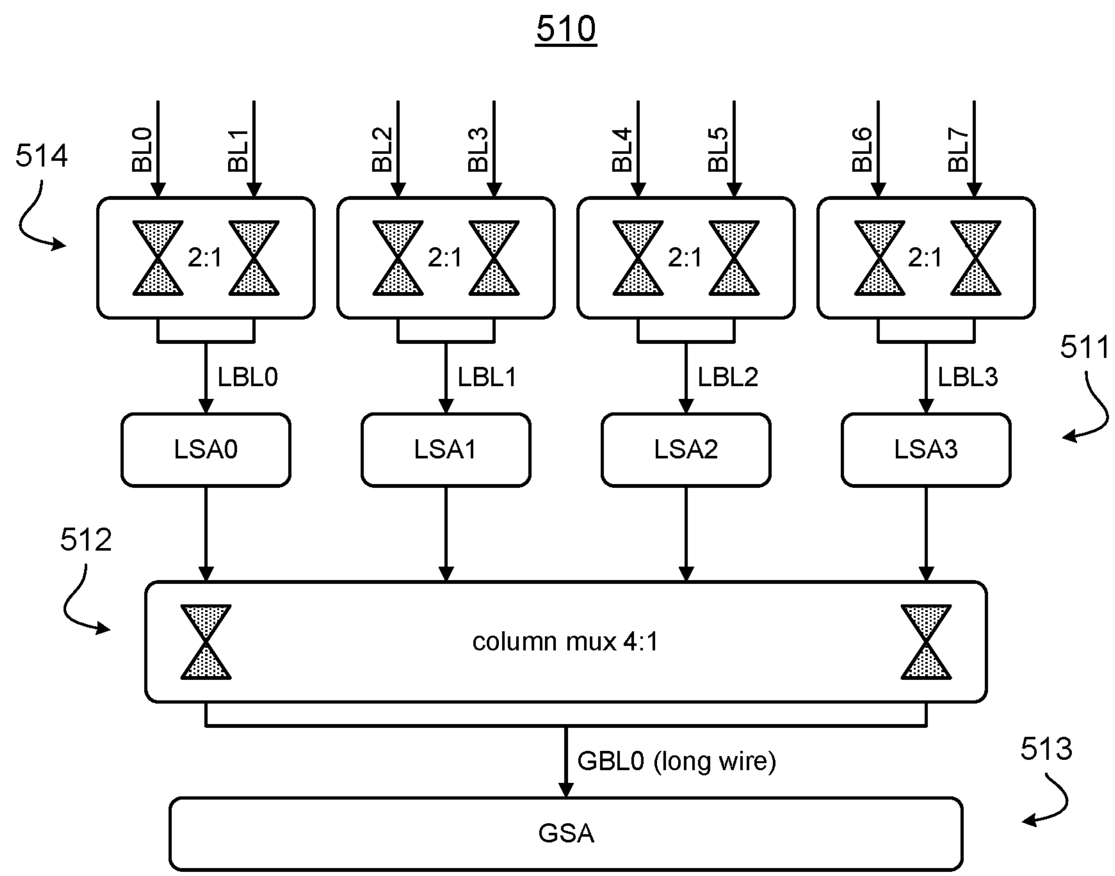
FIG. 5 illustrates a scenario of eDRAM sense amplification design, in accordance with some embodiments of the disclosure.

FIG. 5 illustrates a scenario of eDRAM sense amplification design, in accordance with some embodiments of the disclosure. In a scenario 510, a plurality of bitlines (e.g., bitlines BL 0 to BL 7) may be provided to a pre-LSA column multiplexing circuitry 514 whose output may be provided to an LSA circuitry 511, which may comprise one set of LSAs for local amplification (e.g., four LSAs). The outputs of LSA circuitry 511 may then be provided to a column multiplexing circuitry 512 (e.g., a 4-to-1 column multiplexing circuitry) whose output may be provided to a GSA circuitry 513, which may be over a relatively long wire or signal path.

Accordingly, two-level column multiplexing as disclosed herein may be used to achieve 8-to-1 column multiplexing. The first level (e.g., pre-LSA column multiplexing circuitry 514) may have 2-to-1 column multiplexing using a set of shared LSAs, which may correspond with two sequential reads and write-backs of a pair of bitlines (e.g., a BL 0 and a BL 1). The second level (e.g., column multiplexing circuitry 512) may have 4-to-1 column multiplexing.

For single-access latency, some embodiments incorporating a high bandwidth eDRAM with partially-shared LSAs with two-level column multiplexing may be worse than some embodiments merely incorporating a high bandwidth eDRAM with a shared LSA, since the area allocation of LSA may be smaller. However, a bank blocking latency may be much smaller (e.g., 13 core clock cycles), in comparison with 31 core clock cycles for embodiments merely incorporating a high bandwidth eDRAM with a shared LSA. The bandwidth of some embodiments may accordingly be 64*2*2*4 b (e.g., 128 B) for four sub-arrays every Last-Level Cache (LLC) clock, where the bank blocking latency may be reduced to 13 core clocks.

Figure 6:
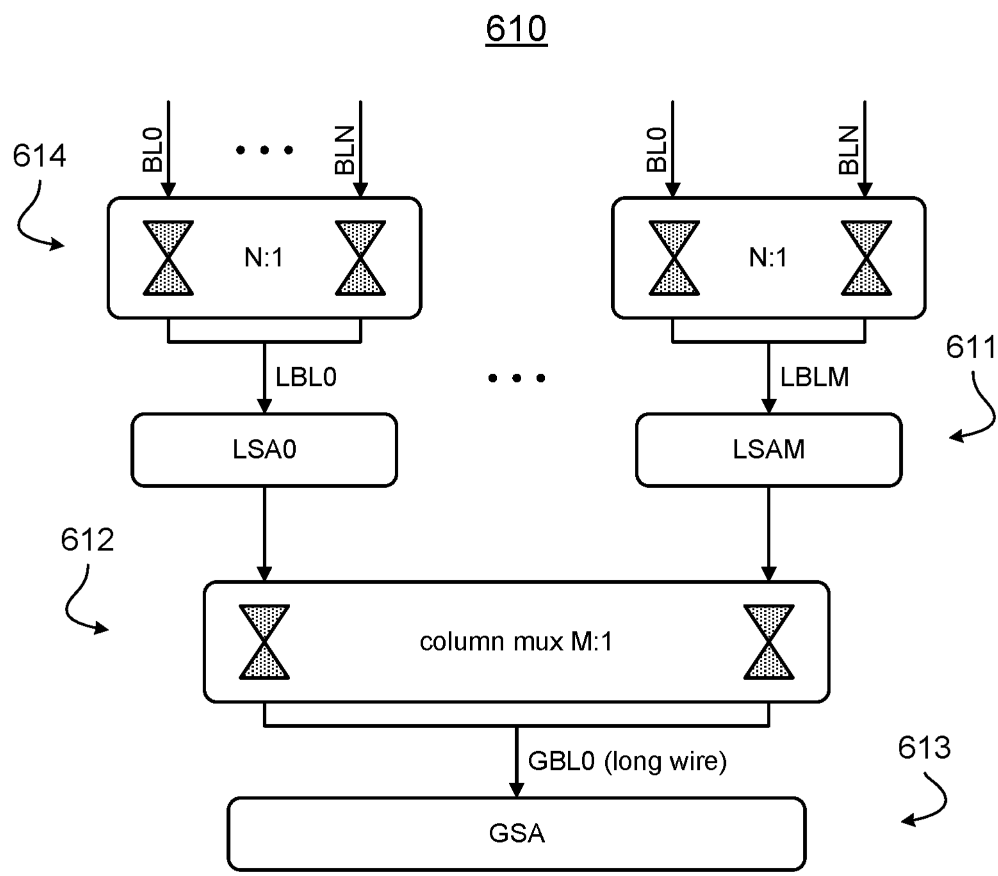
FIG. 6 illustrates a scenario of eDRAM sense amplification design, in accordance with some embodiments of the disclosure.

FIG. 6 illustrates a scenario of eDRAM sense amplification design, in accordance with some embodiments of the disclosure. In scenario 610, a plurality of bitlines (e.g., bitlines from a BL number 0 to a BL number N) may be provided to a pre-LSA column multiplexing circuitry 614, whose output may be provided to an LSA circuitry 611, which may comprise one set of LSAs for local amplification (e.g., a number M of LSAs). The outputs of LSA circuitry 611 may then be provided to a column multiplexing circuitry 612 (e.g., an M-to-1 column multiplexing circuitry) whose output may be provided to a GSA circuitry 613, which may be over a relatively long wire or signal path.

Accordingly, in various embodiments, an eDRAM sense amplification design may incorporate a high bandwidth eDRAM with two-level column multiplexing, having both pre-LSA shared column multiplexing (among sets of a number N of bitlines each), and post-LSA shared column multiplexing (among the outputs of a number M of LSAs).

In a variety of embodiments, an apparatus may comprise a first circuitry, a second circuitry, and a third circuitry. The first circuitry may be operable to store a set of a number N bits of data in a memory (such as a memory array as discussed herein), and to provide the set of N bits of stored data to a set of N bitline signal paths. The second circuitry may be operable to route one of the set of N bitline signal paths to a multiplexed bitline signal path based on a value on a selection input. In various embodiments, the second circuitry may be substantially similar to a pre-LSA column multiplexing circuitry as discussed herein. The third circuitry may be operable to sense a value on the multiplexed bitline signal path, to amplify the sensed value, and to route the amplified value to a sense-amplified bit signal path. In various embodiments, the third circuitry may be substantially similar to an LSA circuitry as discussed herein.

In some embodiments, the second circuitry may be operable to route a series of the set of N bitline signal paths to the multiplexed bitline signal path on the basis of a series of values on the selection input within a single bitline precharge cycle. Accordingly, the second circuitry may be operable to output a series of values based upon the selection of a respectively corresponding series of columns.

For some embodiments, the memory may comprise a destructive-read memory. In some embodiments, the destructive-read memory may include an eDRAM and/or a non-volatile memory.

For some embodiments, the sense-amplified bit signal path may be a first sense-amplified bit signal path, and the apparatus may comprise a fourth circuitry. The fourth circuitry may be operable to sense a value on the first sense-amplified bit signal path, to amplify the sensed value, and to route the amplified value to a second sense-amplified bit signal path. In various embodiments, the fourth circuitry may be substantially similar to a GSA circuitry as discussed herein.

In some embodiments, the first circuitry may be operable to store a plurality of sets of N bits of data and provide the plurality of sets of N bits of data, respectively, to a plurality of sets of N bitline signal paths. The second circuitry may then be operable to route one of each of the sets of N bitline signal paths, respectively, to a plurality of multiplexed bitline signal paths on the basis of the selection input. The third circuitry may be operable to sense a plurality of values, respectively, on the plurality of multiplexed bitline signal paths, to amplify the plurality of values, and to route the plurality of amplified values, respectively, to a plurality of sense-amplified bit signal paths. For some embodiments, the number N and/or the number M may be a power of 2.

Alternatively, in a variety of embodiments, an apparatus may comprise a multiplexor circuitry, a first sense amplifier circuitry, and a second sense amplifier circuitry. The multiplexor circuitry may be operable to route one of a set of N bitline signal paths from a memory circuitry to a multiplexed bitline signal path based on a value on a selection input. In various embodiments, the multiplexor circuitry may be substantially similar to a pre-LSA column multiplexing circuitry as discussed herein. The first sense amplifier circuitry may be operable to sense a value on the multiplexed bitline signal path, to amplify the sensed value, and to route the amplified value to a first sense-amplified bit signal path. In various embodiments, the first sense amplifier circuitry may be substantially similar to an LSA circuitry as discussed herein. The second sense amplifier circuitry may be operable to sense a value on the first sense-amplified bit signal path, to amplify the sensed value, and to route the amplified value to a second sense-amplified bit signal path. In various embodiments, the second sense amplifier circuitry may be substantially similar to a GSA circuitry as discussed herein.

In some embodiments, the first sense amplifier may be operable to route a series of the set of N bitline signal paths to the multiplexed bitline signal path on the basis of a series of values on the selection input within a single bitline precharge cycle. Accordingly, the first sense amplifier circuitry may be operable to output a series of values based upon the selection of a respectively corresponding series of columns.

For some embodiments, the memory may comprise a destructive-read memory that includes an eDRAM and/or or a non-volatile memory. In some embodiments, the apparatus may comprise a memory circuitry operable to store the set of N bits of data, and to provide the set of N bits of stored data to the set of N bitline outputs.

In some embodiments, the multiplexor circuitry may be operable to route one of each of a plurality of sets of N bitline signal paths, respectively, to a plurality of multiplexed bitline signal paths on the basis of the selection input. The sense amplifier circuitry may be operable to sense a plurality of values, respectively, on the plurality of multiplexed bitline signal paths; to amplify the plurality of values; and to route the plurality of amplified values, respectively, to a plurality of sense-amplified bit signal paths. For some embodiments, N may be a power of 2.

Figure 7A:
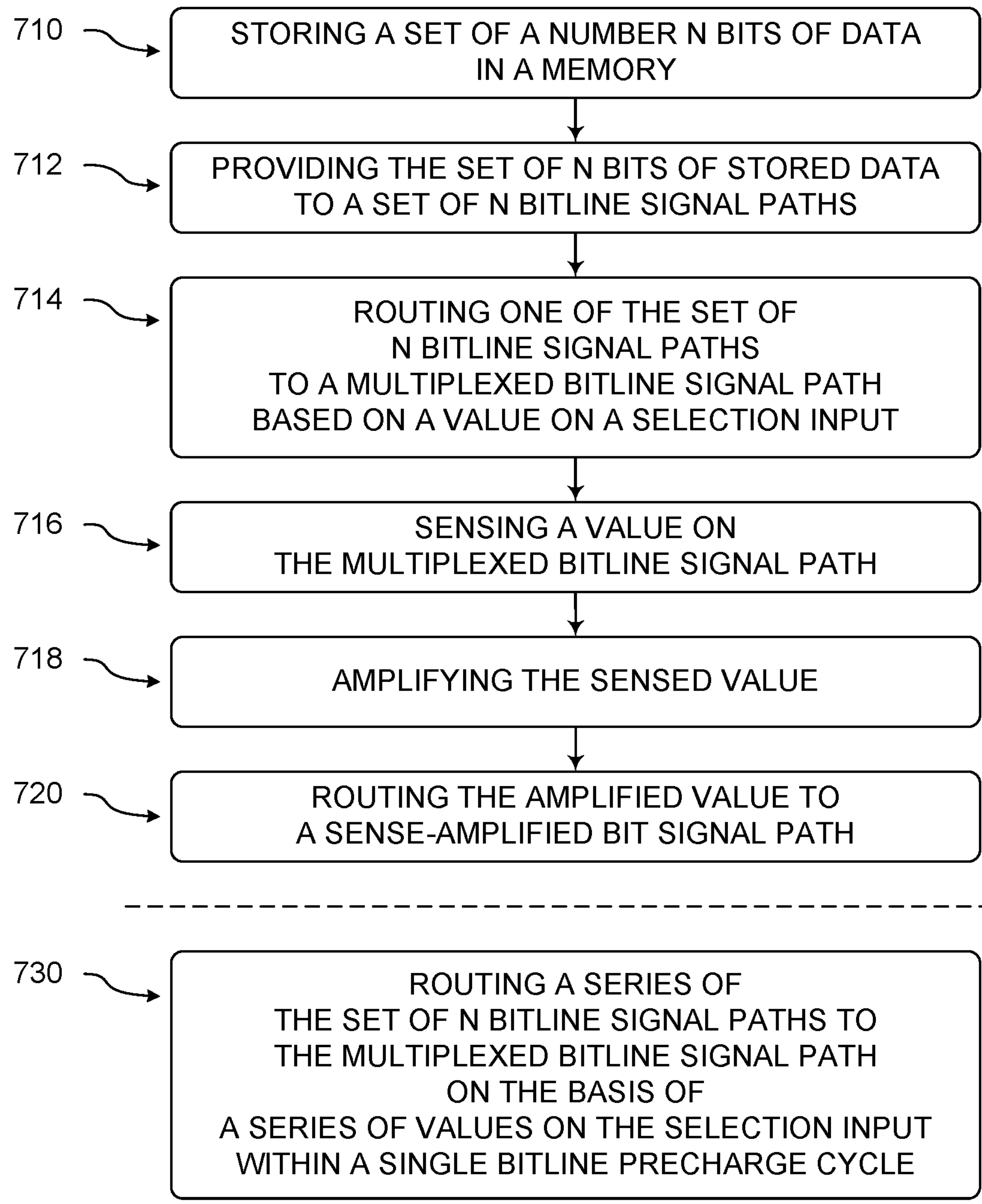
FIGS. 7A-7B illustrate methods for reading a plurality of memory locations sharing a wordline, in accordance with some embodiments of the disclosure.
Figure 7B:
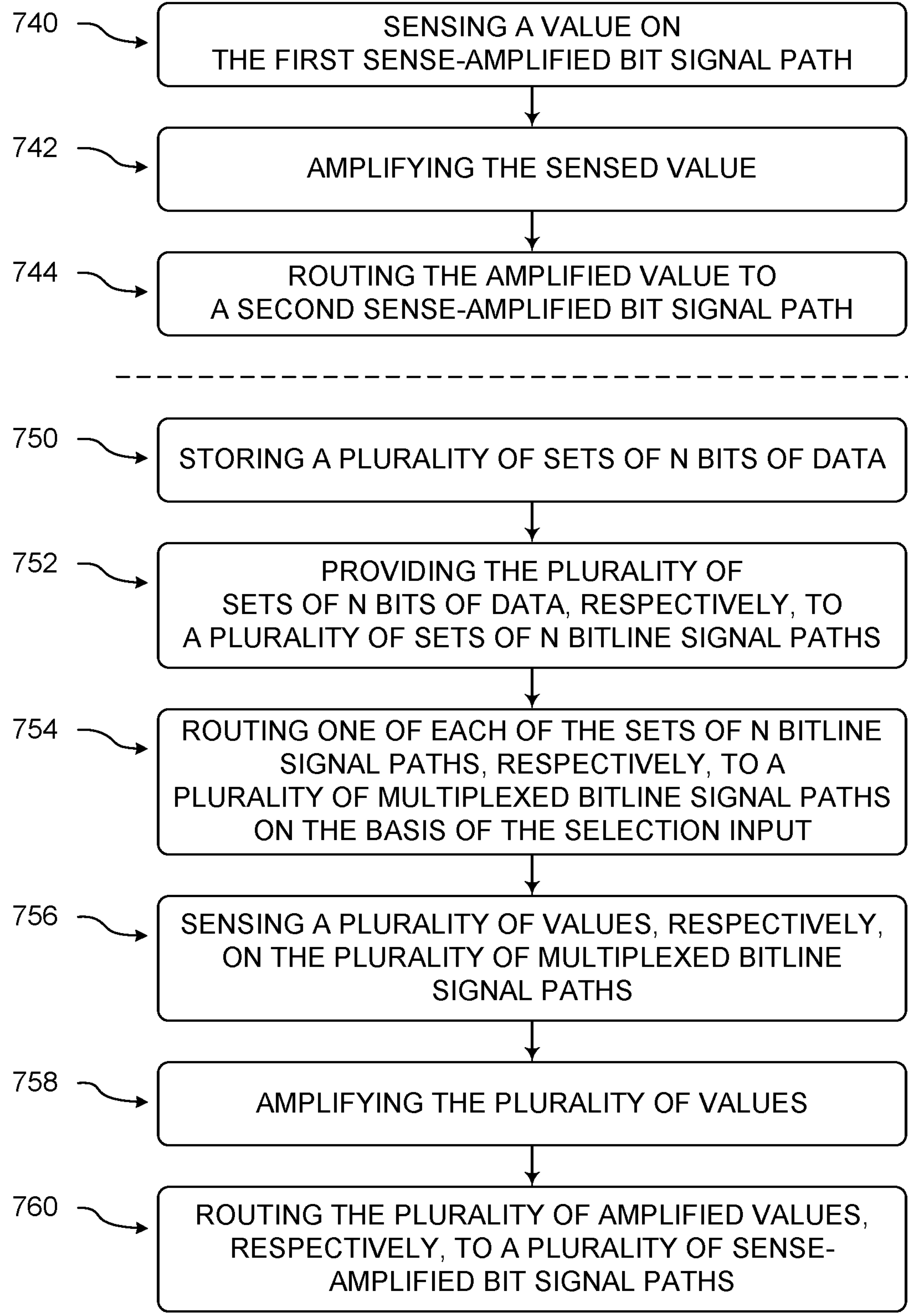

FIGS. 7A-7B illustrate methods for reading a plurality of memory locations sharing a wordline, in accordance with some embodiments of the disclosure. A method 700 may comprise a storing 710, a providing 712, a routing 714, a sensing 716, an amplifying 718, and a routing 720. Method 700 may also comprise a routing 730, a sensing 740, an amplifying 742, a routing 744, a storing 750, a providing 752, a routing 754, a sensing 756, an amplifying 758, and/or a routing 760.

In storing 710, a set of a number N bits of data may be stored in a memory. In providing 712, the set of N bits of stored data may be provided to a set of N bitline signal paths. In routing 714, one of the set of N bitline signal paths may be routed to a multiplexed bitline signal path based on a value on a selection input. In sensing 716, a value on the multiplexed bitline signal path may be sensed. In amplifying 718, the sensed value may be amplified. In routing 720, the amplified value may be routed to a sense-amplified bit signal path.

In some embodiments, in routing 730, a series of the set of N bitline signal paths may be routed to the multiplexed bitline signal path on the basis of a series of values on the selection input within a single bitline precharge cycle. For some embodiments, the memory may comprise a destructive-read memory that includes an eDRAM and/or a non-volatile memory. In some embodiments, N may be a power of 2.

In some embodiments, the sense-amplified bit signal path may be a first sense-amplified bit signal path. In sensing 740, a value on the first sense-amplified bit signal path. In amplifying 742, the sensed value may be amplified. In routing 744, the amplified value may be routed to a second sense-amplified bit signal path.

For some embodiments, in storing 750, a plurality of sets of N bits of data may be stored. In providing 752, the plurality of sets of N bits of data may be provided, respectively, to a plurality of sets of N bitline signal paths. In routing 754, one of each of the sets of N bitline signal paths may be routed, respectively, to a plurality of multiplexed bitline signal paths on the basis of the selection input. In sensing 756, a plurality of values may be sensed, respectively, on the plurality of multiplexed bitline signal paths. In amplifying 758, the plurality of values may be amplified. In routing 760, the plurality of amplified values may be routed, respectively, to a plurality of sense-amplified bit signal paths.

Although the actions in the flowchart with reference to FIGS. 7A-7B are shown in a particular order, the order of the actions can be modified. Thus, the illustrated embodiments can be performed in a different order, and some actions may be performed in parallel. Some of the actions and/or operations listed in FIGS. 7A-7B are optional in accordance with certain embodiments. The numbering of the actions presented is for the sake of clarity and is not intended to prescribe an order of operations in which the various actions must occur. Additionally, operations from the various flows may be utilized in a variety of combinations.

In some embodiments, an apparatus may comprise means for performing various actions and/or operations of the methods of FIGS. 7A-7B.

Moreover, in some embodiments, machine readable storage media may have executable instructions that, when executed, cause one or more processors to perform an operation comprising a method of FIGS. 7A-7B. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Figure 8:
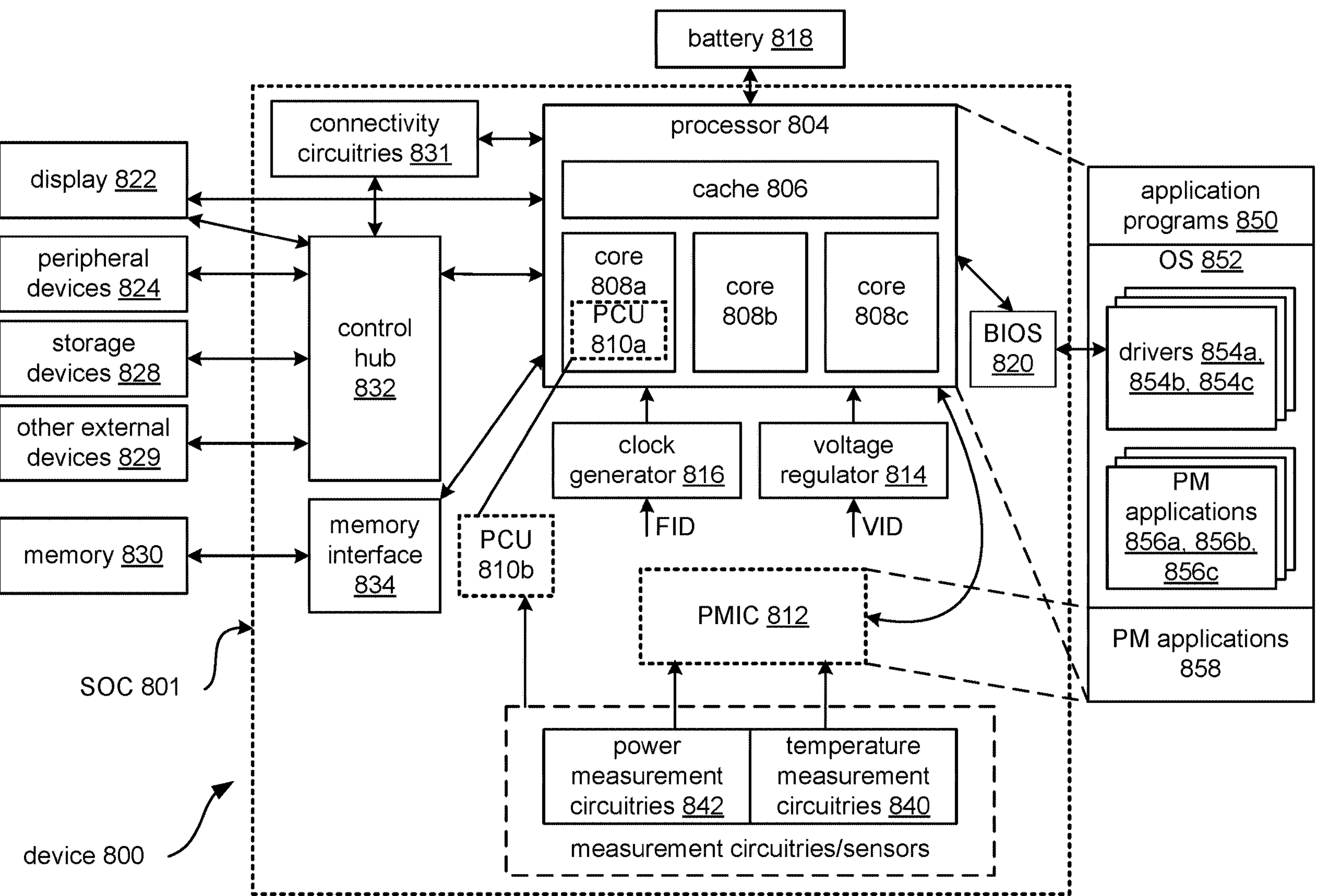
FIG. 8 illustrates a computer system or computing device with mechanisms for reading a plurality of memory locations sharing a wordline, in accordance with some embodiments.

FIG. 8 illustrates a computing device with mechanisms for reading a plurality of memory locations sharing a wordline, in accordance with some embodiments of the disclosure.

FIG. 8 illustrates a computer system or computing device with mechanisms for reading a plurality of memory locations sharing a wordline, in accordance with some embodiments. It is pointed out that those elements of FIG. 8 having the same reference numbers (or names) as the elements of any other figure may operate or function in any manner similar to that described, but are not limited to such.

In some embodiments, a device 800 may comprise an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 800.

In some embodiments, device 800 may comprise a System-on-Chip (SoC) 801. An example boundary of SoC 801 is depicted using dotted lines in FIG. 8, with some example components depicted as being included within SoC 801. However, SoC 801 may include any appropriate components of device 800.

In some embodiments, device 800 may comprise a processor 804. Processor 804 may include one or more physical devices, such as microprocessors, application processors, microcontrollers, programmable logic devices, processing cores, or other processing means. The processing operations performed by processor 804 may include the execution of an operating system or an operating platform on which applications and/or device functions are, in turn, executed. The processing operations may include operations related to I/O (input/output) either with a human user or with other devices, operations related to power management, operations related to connecting computing device 800 to another device, and/or the like. The processing operations may also include operations related to audio I/O and/or display I/O.

In some embodiments, processor 804 may comprise multiple processing cores 808*a*, 808*b*, and 808*c* (also referred to as cores). Although three cores 808*a*, 808*b*, and 808*c* are depicted in FIG. 8, processor 804 may include any appropriate number of cores, e.g., tens of cores or even hundreds of cores. Cores 808*a*, 808*b*, and/or 808*c* may be implemented on a single integrated circuit (IC) chip. Moreover, the chip may include one or more shared and/or private caches, buses or interconnections, graphics and/or memory controllers, and/or other components.

In some embodiments, processor 804 may comprise a cache 806. In some embodiments, sections of cache 806 may be dedicated to individual cores (e.g., a first section of cache 806 may be dedicated to core 808*a*, a second section of cache 806 may be dedicated to core 808*b*, and so on). For some embodiments, one or more sections of cache 806 may be shared among two or more of the cores. Cache 806 may be split into different levels, e.g., a level 1 (L1) cache, a level 2 (L2) cache, a level 3 (L3) cache, and so on. In various embodiments, cache 806 may incorporate mechanisms for reading a plurality of memory locations sharing a wordline (e.g., having pre-LSA column multiplexing) as discussed herein.

In some embodiments, cores 808*a*, 808*b*, and/or 808*c* may include a fetch unit to fetch instructions (including instructions with conditional branches) for execution by the core. The instructions may be fetched from a memory 830 (which may comprise any of a variety of storage devices). Cores 808*a*, 808*b*, and/or 808*c* may also include a decode unit to decode the fetched instruction. For some embodiments, the decode unit may decode fetched instruction into a plurality of micro-operations. Cores 808*a*, 808*b*, and/or 808*c* may also include a schedule unit to perform various operations associated with storing decoded instructions. In some embodiments, the schedule unit may hold data from the decode unit until the instructions are ready for dispatch, e.g., until all source values of a decoded instruction become available. For some embodiments, the schedule unit may schedule and/or issue (or dispatch) decoded instructions to an execution unit for execution.

The execution unit may execute dispatched instructions after they are decoded (e.g., by the decode unit) and dispatched (e.g., by the schedule unit). In some embodiments, the execution unit may include more than one type of execution unit (such as an imaging computational unit, a graphics computational unit, a general-purpose computational unit, and so on). The execution unit may also perform various arithmetic operations such as addition, subtraction, multiplication, and/or division, and may include one or more arithmetic logic units (ALUs). For some embodiments, a co-processor (not shown) may perform various arithmetic operations in conjunction with the execution unit.

Furthermore, the execution unit may execute instructions out-of-order. Accordingly, in some embodiments, cores 808*a*, 808*b*, and/or 808*c* may comprise an out-of-order processor core. Cores 808*a*, 808*b*, and/or 808*c* may also include a retirement unit. The retirement unit may retire executed instructions after they are committed. For some embodiments, retirement of the executed instructions may result in processor state being committed from the execution of the instructions, physical registers used by the instructions being de-allocated, and so on. Cores 808*a*, 808*b*, and/or 808*c* may also include a bus unit to enable communication between components of the core and other components via one or more buses. Cores 808*a*, 808*b*, and/or 808*c* may additionally include one or more registers to store data accessed by various components of the core (such as values related to assigned app priorities and/or sub-system states (modes) association.

In some embodiments, device 800 may comprise one or more connectivity circuitries 831, which may include hardware devices (e.g., wireless and/or wired connectors and communication hardware) and/or software components (e.g., drivers, protocol stacks, and so on) to enable device 800 to communicate with external devices. Device 800 may be separate from the external devices, such as other computing devices, wireless access points or base stations, and so on.

In some embodiments, connectivity circuitries 831 may include circuitries directed toward multiple different types of connectivity (e.g., connectivity protocols). To generalize, connectivity circuitries 831 may include cellular connectivity circuitries, wireless connectivity circuitries, and so on. Cellular connectivity circuitries of connectivity circuitries 831 may refer generally to cellular network connectivity provided by wireless carriers, such as via GSM (global system for mobile communications) or variations or derivatives thereof, via CDMA (code division multiple access) or variations or derivatives thereof, via TDM (time division multiplexing) or variations or derivatives thereof, via 3rd Generation Partnership Project (3GPP) Universal Mobile Telecommunications Systems (UMTS) system or variations or derivatives thereof, via 3GPP Long-Term Evolution (LTE) system or variations or derivatives thereof, via 3GPP LTE-Advanced (LTE-A) system or variations or derivatives thereof, via Fifth Generation (5G) wireless system or variations or derivatives thereof, via 5G mobile networks system or variations or derivatives thereof, via 5G New Radio (NR) system or variations or derivatives thereof, or via other cellular service standards.

Wireless connectivity circuitries (or wireless interfaces) of connectivity circuitries 831 may refer generally to wireless connectivity that is not cellular, and may include personal area networks (such as Bluetooth, Near Field, and so on), local area networks (such as Wi-Fi), wide area networks (such as WiMax), and/or other wireless communication. For some embodiments, connectivity circuitries 831 may include a network interface, such as a wired or wireless interface, so that a system embodiment may be incorporated into a wireless device (for example, into a cell phone or a personal digital assistant).

In some embodiments, device 800 may comprise a control hub 832, which may represent hardware devices and/or software components related to interaction with one or more I/O devices. Control hub 832 may be a chipset, a Platform Control Hub (PCH), and/or the like. Via control hub 832, processor 804 may communicate with a display 822 (or one or more displays), one or more peripheral devices 824, one or more storage devices 828, one or more other external devices 829, and so on.

Control hub 832 may provide one or more connection points for additional devices that connect to device 800, through which a user might interact with the system. In some embodiments, devices that can be attached to device 800 (e.g., external devices 829) may include microphone devices, speaker or stereo systems, audio devices, video systems or other display devices, keyboard or keypad devices, and/or other I/O devices for use with specific applications such as card readers or other devices.

As mentioned above, control hub 832 can interact with audio devices, display 822, and so on. In some embodiments, input through a microphone or other audio device may provide input or commands for one or more applications or functions of device 800. Additionally, audio output may be provided instead of, or in addition to display output. For some embodiments, if display 822 includes a touch screen, display 822 may also act as an input device, which may be at least partially managed by control hub 832. There may also be additional buttons or switches on computing device 800 to provide I/O functions managed by control hub 832. In some embodiments, control hub 832 may manage devices such as accelerometers, cameras, light sensors or other environmental sensors, or other hardware that can be included in device 800. The input may be part of direct user interaction, and may also provide environmental input to the system to influence its operations (such as filtering for noise, adjusting displays for brightness detection, applying a flash for a camera, or other features).

In some embodiments, control hub 832 may couple to various devices using any appropriate communication protocol, e.g., PCIe (Peripheral Component Interconnect Express), USB (Universal Serial Bus), Thunderbolt, High Definition Multimedia Interface (HDMI), Firewire, and so on.

In some embodiments, display 822 may represent hardware components (e.g., display devices) and software components (e.g., drivers) that provide a visual and/or tactile display for a user to interact with device 800. Display 822 may include a display interface, a display screen, and/or hardware device used to provide a display to a user. In some embodiments, display 822 may include a touch screen (or touch pad) device that provides both output and input to a user. In some embodiments, display 822 may communicate directly with processor 804. Display 822 may be an internal display device (e.g., as in a mobile electronic device or a laptop device) or an external display device attached via a display interface (e.g., DisplayPort, and so on). For some embodiments, display 822 may be a head mounted display (HMD) such as a stereoscopic display device for use in virtual reality (VR) applications or augmented reality (AR) applications.

In some embodiments, in addition to (or instead of) processor 804, device 800 may include a Graphics Processing Unit (GPU) (not depicted in the figure). The GPU may comprise one or more graphics processing cores, which may control one or more aspects of displaying contents on display 822.

For some embodiments, control hub 832 may include hardware interfaces and connectors, as well as software components (e.g., drivers, protocol stacks, and so on) to make peripheral connections, e.g., to peripheral devices 824.

It will be understood that device 800 could both be a peripheral device to other computing devices, as well as have peripheral devices connected to it. Device 800 may have a "docking" connector to connect to other computing devices for purposes such as managing content (e.g., downloading and/or uploading, changing, and/or synchronizing content) on device 800. Additionally, a docking connector may allow device 800 to connect to certain peripherals that allow computing device 800 to control content output (e.g., to audiovisual systems and/or other systems).

In addition to a proprietary docking connector or other proprietary connection hardware, device 800 may make peripheral connections via common or standards-based connectors. Such connectors may include a Universal Serial Bus (USB) connector (which may include any of a number of different hardware interfaces), a DisplayPort connector or MiniDisplayPort (MDP) connector, a High Definition Multimedia Interface (HDMI) connector, a Firewire connector, or other types of connectors.

In some embodiments, connectivity circuitries 831 may be coupled to control hub 832, e.g., in addition to, or instead of, being coupled directly to processor 804. In some embodiments, display 822 may be coupled to control hub 832, e.g., in addition to, or instead of, being coupled directly to processor 804.

In some embodiments, device 800 may comprise memory 830, which may be coupled to processor 804 via a memory interface 834. Memory 830 may include memory devices for storing information in device 800. Memory devices may include nonvolatile memory devices (for which state might not change if power to the memory device is interrupted) and/or volatile memory devices (for which state may be indeterminate, or lost, if power to the memory device is interrupted). Memory 830 may comprise a dynamic random access memory (DRAM) device, a static random access memory (SRAM) device, a flash memory device, a phase-change memory device, or another memory device (e.g., a memory device having performance suitable for serving as process memory). In various embodiments, memory 830 may incorporate mechanisms for reading a plurality of memory locations sharing a wordline (e.g., having pre-LSA column multiplexing) as discussed herein.

In some embodiments, memory 830 may operate as system memory for device 800, to store data and instructions for use when the one or more processors (e.g., processor 804) executes an application or process. Memory 830 may store application data, user data, music, photos, documents, or other data, as well as system data (whether long-term or temporary) related to the execution of the applications and functions of device 800.

Elements of various embodiments and examples may also be provided as a machine-readable medium (e.g., memory 830) for storing the computer-executable instructions (e.g., instructions to implement any other processes discussed herein). The machine-readable medium (e.g., memory 830) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. Some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, one or more measurement circuitries and/or sensors of device 800 may comprise temperature measurement circuitries 840, e.g., for measuring temperature of various components of device 800. In some embodiments, temperature measurement circuitries 840 may be embedded, or coupled or attached to various components, whose temperature are to be measured and monitored. For some embodiments, temperature measurement circuitries 840 may measure temperatures of (or within) one or more of cores 808*a*, 808*b*, 808*c*, a voltage regulator 814, memory 830, a mother-board of SoC 801, and/or any other appropriate component of device 800.

In some embodiments, the measurement circuitries and/or sensors of device 800 may comprise one or more power measurement circuitries 842, e.g., for measuring power consumed by one or more components of the device 800. For some embodiments, power measurement circuitries 842 may measure power, voltage, and/or current. In some embodiments, power measurement circuitries 842 may be embedded, coupled, or attached to various components whose power, voltage, and/or current consumption are to be measured and monitored. For some embodiments, power measurement circuitries 842 may measure: power, voltage, and/or current supplied by voltage regulator 814 (which may comprise one or more voltage regulator); power supplied to SoC 801; power supplied to device 800; power consumed by processor 804 (or any other component) of device 800; and so on.

In some embodiments, device 800 may comprise one or more voltage regulator circuitries in voltage regulator 814. Voltage regulator 814 may generate signals at appropriate voltage levels, which may be supplied to operate any appropriate components of the device 800. As an example, voltage regulator 814 is depicted as supplying one or more signals (e.g., voltage signals) to processor 804 of device 800. In some embodiments, voltage regulator 814 may receive one or more Voltage Identification (VID) signals, and generates the voltage signals (e.g., to processor 804) at appropriate levels, based on the VID signals. Various type of VRs may be utilized for voltage regulator 814. In some embodiments, voltage regulator 814 may include a "buck" voltage regulator, a "boost" voltage regulator, a combination of buck and boost voltage regulators, low dropout (LDO) regulators, switching DC-DC regulators, and so on. Buck voltage regulators may be used in power delivery applications in which an input voltage is transformed to an output voltage in a ratio that is smaller than unity. Boost voltage regulators may be used in power delivery applications in which an input voltage is transformed to an output voltage in a ratio that is larger than unity. In some embodiments, each processor core may have its own voltage regulator, which may be controlled by a Power Control Unit (PCU) 810*a*, a PCU 810*b*, and/or a Power Management Integrated Circuit (PMIC) 812. In some embodiments, each core may have a network of distributed LDOs to provide efficient control for power management. The LDOs may be digital, analog, or a combination of digital or analog LDOs.

In some embodiments, device 800 may comprise one or more clock generator circuitries in a clock generator 816. Clock generator 816 generates clock signals at appropriate frequency levels, which may be supplied to any appropriate components of device 800. As an example, clock generator 816 is depicted as supplying clock signals to processor 804 of device 800. In some embodiments, clock generator 816 may receive one or more Frequency Identification (FID) signals, and may generate the clock signals at an appropriate frequency, based on the FID signals.

In some embodiments, device 800 may comprise a battery 818 supplying power to various components of device 800. As an example, battery 818 is depicted as supplying power to processor 804. Although not depicted in the figures, device 800 may comprise a charging circuitry, e.g., to recharge the battery based on an Alternating Current (AC) power supply received from an AC adapter.

In some embodiments, device 800 may comprise PCU 810*a* and/or PCU 810*b* (which may also be referred to as Power Management Units (PMUs), Power Controllers, and so on). In some embodiments, PCU 810*a* may be implemented by one or more of cores 808*a*, 808*b*, and/or 808*c*, as is symbolically depicted using a dotted box labelled PCU 810*a*. For some embodiments, PCU 810*b* may be implemented outside the cores, as is symbolically depicted using a dotted box labelled PCU 810*b*. PCU 810*a* and/or PCU 810*b* may implement various power management operations for device 800. PCU 810*a* and/or PCU 810*b* may include hardware interfaces, hardware circuitries, connectors, registers, and so on, as well as software components (e.g., drivers, protocol stacks), to implement various power management operations for device 800.

In some embodiments, device 800 may comprise PMIC 812, e.g., to implement various power management operations for device 800. In some embodiments, PMIC 812 may be a Reconfigurable Power Management ICs (RPMICs) and/or an IMVP (Intel® Mobile Voltage Positioning). In some embodiments, the PMIC may be within an IC chip separate from processor 804. The may implement various power management operations for device 800. PMIC 812 may include hardware interfaces, hardware circuitries, connectors, registers, and so on, as well as software components (e.g., drivers, protocol stacks), to implement various power management operations for device 800.

For some embodiments, device 800 may comprise PCU 810*a*, PCU 810*b*, and/or PMIC 812. In some embodiments, any one of PCU 810*a*, PCU 810*b*, and/or PMIC 812 may be absent in device 800, and hence, these components are depicted using dotted lines.

Various power management operations of device 800 may be performed by PCU 810*a*, PCU 810*b*, PMIC 812, or by a combination thereof. For some embodiments, PCU 810*a*, PCU 810*b*, and/or PMIC 812 may select a power state (e.g., a P-state) for various components of device 800. In some embodiments, PCU 810*a*, PCU 810*b*, and/or PMIC 812 may select a power state for various components of device 800 (e.g., in accordance with the ACPI (Advanced Configuration and Power Interface) specification). In some embodiments, for example, PCU 810*a*, PCU 810*b*, and/or PMIC 812 may cause various components of the device 800 to transition to a sleep state, to an active state, to an appropriate C state (e.g., CO state, or another appropriate C state, in accordance with the ACPI specification), and so on.

For some embodiments, PCU 810*a*, PCU 810*b*, and/or PMIC 812 may control a voltage output by voltage regulator 814 and/or a frequency of a clock signal output by the clock generator, e.g., by outputting the VID signals and/or the FID signals, respectively. In some embodiments, PCU 810*a*, PCU 810*b*, and/or PMIC 812 may control battery power usage, charging of battery 818, and features related to power saving operation.

Clock generator 816 may comprise a phase locked loop (PLL), frequency locked loop (FLL), or any suitable clock source. In some embodiments, each core of processor 804 may have its own clock source. As such, each core may operate at a frequency independent of the frequency of operation of the other core. In some embodiments, PCU 810*a*, PCU 810*b*, and/or PMIC 812 may perform adaptive or dynamic frequency scaling or adjustment. For some embodiments, clock frequency of a processor core may be increased if the core is not operating at its maximum power consumption threshold or limit. In some embodiments, PCU 810*a*, PCU 810*b*, and/or PMIC 812 may determine the operating condition of each core of a processor, and may opportunistically adjust frequency and/or power supply voltage of that core without the core clocking source (e.g., a PLL of that core) losing lock when PCU 810*a*, PCU 810*b*, and/or PMIC 812 determines that the core is operating below a target performance level. In some embodiments, if a core is drawing current from a power supply rail less than a total current that is allocated for that core (or for processor 804), then PCU 810*a*, PCU 810*b*, and/or PMIC 812 may temporality increase the power draw for that core (or for processor 804), for example, by increasing a clock frequency and/or a power supply voltage level, so that the core or processor 804 can perform at a higher performance level. As such, in various embodiments, voltage and/or frequency may be increased temporality for processor 804 without violating product reliability.

For some embodiments, PCU 810*a*, PCU 810*b*, and/or PMIC 812 may perform power management operations, e.g., based at least in part on receiving measurements from power measurement circuitries 842, temperature measurement circuitries 840, charge level of battery 818, and/or any other appropriate information that may be used for power management. To that end, PMIC 812 may be communicatively coupled to one or more sensors to sense and/or detect various values of and/or variations in one or more factors having an effect on power and/or thermal behavior of the system or platform. Examples of the one or more factors may include electrical current, voltage droop, temperature, operating frequency, operating voltage, power consumption, inter-core communication activity, and so on. Sensors for one or more of these factors may be provided in physical proximity to (and/or in thermal contact with or thermally coupled to) one or more components or logic/IP blocks of a computing system (e.g., a computing system of device 800). Additionally, in some embodiments, sensor(s) may be directly coupled to PCU 810*a*, PCU 810*b*, and/or PMIC 812 to allow PCU 810*a*, PCU 810*b*, and/or PMIC 812 to manage processor core energy at least in part based on value(s) detected by one or more of the sensors.

Also depicted is an example software stack of device 800 (although not all elements of the software stack are depicted). In various embodiments, processor 804 may execute application programs 850, Operating System (OS) 852, one or more Power Management (PM) specific application programs (e.g., generically referred to as PM applications 858), and/or the like. PM applications 858 may also be executed by PCU 810*a*, PCU 810*b*, and/or PMIC 812. OS 852 may also include one or more PM applications 856*a*, 856*b*, 856*c*, and so on. OS 852 may also include various drivers 854*a*, 854*b*, 854*c*, and so on, some of which may be specific for power management purposes. In some embodiments, device 800 may further comprise a Basic Input/Output System (BIOS) 820. BIOS 820 may communicate with OS 852 (e.g., via one or more of drivers 854*a*, 854*b*, 854*c*, and so on), communicate with processor 804, and so on.

In various embodiments, one or more of PM applications 858, drivers that OS 852 includes (e.g., drivers 854*a*, 854*b*, 854*c*, and so on), PM applications that OS 852 includes (e.g., PM applications 856*a*, 856*b*, 856*c*, and so on), BIOS 820, and so on may be used to implement power management specific tasks. For example, these components may be used to control voltage and/or frequency of various components of device 800, to control wake-up state, sleep state, and/or any other appropriate power state of various components of device 800, to control battery power usage, to control a charging of the battery 818, to control features related to power saving operation, and so on.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a first circuitry to store a set of a number N bits of data in a memory and provide the set of N bits of stored data to a set of N bitline signal paths;

a second circuitry operable to route a series of the set of N bitline signal paths to a multiplexed bitline signal path based on a value on a series of values on a selection input within a precharge cycle; and a third circuitry to sense a value on the multiplexed bitline signal path, to amplify the sensed value, and to route the amplified value to a sense-amplified bit signal path.

2. The apparatus of claim 1, wherein the precharge cycle is a single bitline precharge cycle.

3. The apparatus of claim 1, wherein the memory comprises a destructive-read memory.

4. The apparatus of claim 3, wherein the destructive-read memory includes one of: an embedded Dynamic Random Access Memory (eDRAM); or a non-volatile memory.

5. The apparatus of claim 1, wherein the sense-amplified bit signal path is a first sense-amplified bit signal path, comprising:

a fourth circuitry to sense a value on the first sense-amplified bit signal path, to amplify the sensed value, and to route the amplified value to a second sense-amplified bit signal path.

6. The apparatus of claim 1, wherein the first circuitry is to store a plurality of sets of N bits of data and provide the plurality of sets of N bits of data, respectively, to a plurality of sets of N bitline signal paths;

wherein the second circuitry is to route one of each of the sets of N bitline signal paths, respectively, to a plurality of multiplexed bitline signal paths on a basis of the selection input; and wherein the third circuitry is to sense a plurality of values, respectively, on the plurality of multiplexed bitline signal paths; to amplify the plurality of values; and to route the plurality of amplified values, respectively, to a plurality of sense-amplified bit signal paths.

7. The apparatus of claim 1, wherein N is a power of 2.

8. The apparatus of claim 1, wherein the first circuitry comprises a column multiplexor circuitry.

9. The apparatus of claim 1, wherein the third circuitry comprises a local sense amplifier circuitry.

10. An apparatus comprising:

a multiplexor circuitry to route one of a set of N bitline signal paths from a memory circuitry to a multiplexed bitline signal path based on a value on a selection input;

a first sense amplifier circuitry to sense a value on the multiplexed bitline signal path, to amplify the sensed value, and to route the amplified value to a first sense-amplified bit signal path, wherein the first sense amplifier circuitry is operable to route a series of the set of N bitline signal paths to the multiplexed bitline signal path; and a second sense amplifier circuitry to sense a value on the first sense-amplified bit signal path, to amplify the sensed value, and to route the amplified value to a second sense-amplified bit signal path.

11. The apparatus of claim 10, wherein the first sense amplifier circuitry is operable to route the series of the set of N bitline signal paths to the multiplexed bitline signal path on a basis of a series of values on the selection input within a bitline precharge cycle.

12. The apparatus of claim 10, wherein the memory comprises a destructive-read memory that includes one of: an embedded Dynamic Random-Access Memory (eDRAM); or a non-volatile memory.

13. The apparatus of claim 10, comprising:

a memory circuitry to store a set of N bits of data and provide the set of N bits of stored data to the set of N bitline signal paths.

14. The apparatus of claim 10, wherein the multiplexor circuitry is to route one of each of a plurality of sets of N bitline signal paths, respectively, to a plurality of multiplexed bitline signal paths on a basis of the selection input; and wherein the sense amplifier circuitry is to sense a plurality of values, respectively, on the plurality of multiplexed bitline signal paths; to amplify the plurality of values; and to route the plurality of amplified values, respectively, to a plurality of sense-amplified bit signal paths.

15. The apparatus of claim 10, wherein N is a power of 2.

16. The apparatus of claim 10, wherein the multiplexor circuitry comprises a column multiplexor circuitry;

wherein the first sense amplifier circuitry comprises a local sense amplifier circuitry; and wherein the second sense amplifier circuitry comprises a global sense amplifier circuitry.

17. A system comprising a memory, a processor coupled to the memory, and a wireless interface to allow the processor to communicate with another device, the processor including:

a first circuitry to store a set of a number N bits of data in a memory and provide the set of N bits of stored data to a set of N bitline signal paths;

a second circuitry to route a series of the set of N bitline signal paths to a multiplexed bitline signal path based on a value on a series of values on a selection input within a precharge cycle; and a third circuitry to sense a value on the multiplexed bitline signal path, to amplify the sensed value, and to route the amplified value to a first sense-amplified bit signal path.

18. The system of claim 17, wherein the precharge cycle is a single bitline precharge cycle; and wherein the memory comprises a destructive-read memory including one of: an embedded Dynamic Random-Access Memory (eDRAM); or a non-volatile memory.

19. The system of claim 17, wherein the first circuitry is to store a plurality of sets of N bits of data and provide the plurality of sets of N bits of data, respectively, to a plurality of sets of N bitline signal paths;

wherein the second circuitry is to route one of each of the sets of N bitline signal paths, respectively, to a plurality of multiplexed bitline signal paths on a basis of the selection input; and wherein the third circuitry is to sense a plurality of values, respectively, on the plurality of multiplexed bitline signal paths; to amplify the plurality of values; and to route the plurality of amplified values, respectively, to a plurality of sense-amplified bit signal paths.

20. The system of claim 17, wherein N is a power of 2;

wherein the first circuitry comprises a column multiplexor circuitry; and wherein the third circuitry comprises a local sense amplifier circuitry.

21. The system of claim 17, wherein the processor includes a fourth circuitry to sense a value on the first sense-amplified bit signal path, to amplify the sensed value, and to route the amplified value to a second sense-amplified bit signal path.

* * * * *